United States Patent
Gelhausen et al.

(10) Patent No.: US 7,256,660 B2
(45) Date of Patent: Aug. 14, 2007

(54) CMOS LC-TANK OSCILLATOR

(75) Inventors: Frank Gelhausen, Isernhagen (DE); Karlheinz Muth, Hannover (DE)

(73) Assignee: Texas Instruments Deutschland, GmbH, Freising (DE)

( * ) Notice: Subject to any disclaimer, the term of this patent is extended or adjusted under 35 U.S.C. 154(b) by 127 days.

(21) Appl. No.: 11/132,908

(22) Filed: May 19, 2005

(65) Prior Publication Data

US 2006/0132253 A1    Jun. 22, 2006

(30) Foreign Application Priority Data

May 25, 2004    (DE)    ...................... 10 2004 025 545

(51) Int. Cl.
*H03B 5/00*    (2006.01)
(52) U.S. Cl. ............................... 331/117 FE; 331/167; 331/117 R; 331/185
(58) Field of Classification Search .......... 331/117 FE, 331/167, 185, 117 R
See application file for complete search history.

(56) References Cited

U.S. PATENT DOCUMENTS 6,765,448 B2 * 7/2004 Wu et al. .............. 331/117 FE

FOREIGN PATENT DOCUMENTS

DE    2113589 A1    9/1972
DE    10246844 B3    9/2004

* cited by examiner

*Primary Examiner*—Arnold Kinkead
(74) *Attorney, Agent, or Firm*—Wade J. Brady, III; Frederick J. Telecky, Jr.

(57) ABSTRACT

A CMOS LC-tank oscillator includes a pair of symmetric inductors and a differential pair of transistors. The inductors have a first one of their terminals interconnected at a supply node to which a voltage supply is applied through a supply resistor and a second terminal connected to the drain of a respective one of the transistors. The transistors have their sources interconnected at a tail node which is connected to ground through a tail resistor. A current control loop controls a core current between the supply and tail nodes so as to keep a voltage drop across the tail resistor at a level determined by a reference voltage. The current control loop keeps the core current between the supply and tail nodes at the required level so that a resistor may replace the upstream supply voltage regulator and another resistor may replace the downstream bias regulator. Consequently, sources of noise injected into the LC-tank type oscillator are eliminated.

4 Claims, 1 Drawing Sheet

CMOS LC-TANK OSCILLATOR

CROSS REFERENCE TO RELATED APPLICATIONS

This application claims priority under 35 USC § 119 of German Application Ser. No. 10 2004 025 545.8, filed May 25, 2004.

FIELD OF THE INVENTION

The present invention relates to a CMOS LC-tank oscillator that comprises a pair of symmetric inductors and a differential pair of transistors.

BACKGROUND OF THE INVENTION

For many applications in high speed communication technology stable clock signals are needed that show random jitter contents below limits specified in the applying standards. Examples for these applications are clock and data recovery circuits and synthesizers for wireless communication links.

To meet the jitter requirements of the applying standards oscillator circuits are needed that generate clock signals which containing the least possible amount of phase noise. Furthermore it is desirable to implement all necessary functionality as a monolithic integrated circuit (IC) to lower the power dissipation, the part count and the space needed for the circuitry (and thus reducing costs).

Therefore efforts have been made to integrate LC-tank type oscillators on monolithic integrated circuits. This type of oscillator shows a significantly better phase noise performance than so called ring oscillators, which are widely used for integrated circuits. This is due to the properties of the LC-tank, which offers a steep phase response versus frequency at its resonant frequency and therefore supports a stable oscillation. However, the supporting circuitry such as bias and supply voltage regulators have to be carefully designed, since noise injected into the LC-tank type oscillator by this circuitry can significantly degrade the phase noise performance.

SUMMARY OF THE INVENTION

The present invention provides a CMOS LC-tank oscillator wherein the bias and supply voltage regulators are eliminated thereby avoiding the use of circuitry that would degrade the phase noise performance.

Specifically, the invention provides a CMOS LC-tank oscillator that comprises a pair of symmetric inductors and a differential pair of transistors. The inductors have a first one of their terminals interconnected at a supply node to which a voltage supply is applied through a supply resistor and a second terminal connected to the drain of a respective one of the transistors. The transistors have their sources interconnected at a tail node which is connected to ground through a tail resistor. A current control loop controls a core current between the supply and tail nodes so as to keep a voltage drop across the tail resistor at a level determined by a reference voltage. The current control loop keeps the core current between the supply and tail nodes at the required level so that a resistor may replace the upstream supply voltage regulator and another resistor may replace the downstream bias regulator. Consequently, sources that inject noise into the LC-tank type oscillator are eliminated, and the phase noise performance is improved, even though the circuit design is simplified and the resulting integrated CMOS circuit made cheaper.

In a preferred embodiment, the current control loop includes a controlled current path between the supply node and ground. The controlled current path is advantageously formed by a transistor, the current path of which is connected between the supply node and ground. An operational amplifier has a first input connected to the reference voltage, a second input connected to the tail node and an output connected to the gate of the current control transistor. Thus, the current control loop requires only a few components that can be easily incorporated in the circuit design.

DETAILED DESCRIPTION OF THE DRAWINGS

Figure 1:
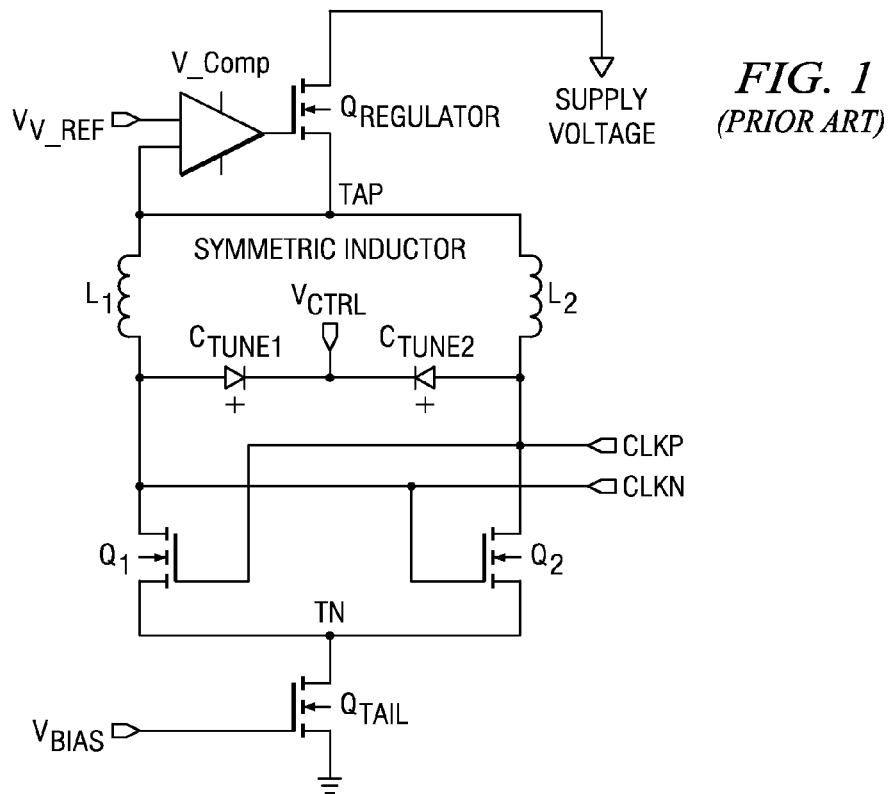
FIG. 1 is a circuit diagram of a conventional monolithic integrated LC-tank oscillator.

With reference to FIG. 1, a conventional topology of an integrated LC-tank oscillator in CMOS technology is shown. It has a symmetric inductor consisting of inductors $L_1$, $L_2$ and a differential NMOS transistor pair $Q_1$, $Q_2$. The clock signal generated by this oscillator is the differential output voltage at terminals CLKP and CLKN. Its frequency can be tuned within a certain range by a control voltage applied to capacitive diodes $C_{tune1}$ and $C_{tune2}$ at terminal VCTRL. The oscillator is therefore a voltage controlled oscillator (VCO). The VCO core consists of the LC-Tank (symmetric inductors $L_1$ and $L_2$ and tuneable capacitors $C_{TUNE1}$ and $C_{TUNE2}$) and the NMOS differential pair $Q_1$ and $Q_2$. The VCO tail current is generated by the NMOS current source transistor $Q_{TAIL}$ that has its gate connected to a bias voltage source $V_{BIAS}$.

The supply voltage for the VCO core at a supply node Tap (the center tap) of the symmetric inductor is generated by a voltage regulator. The regulator consists of a transistor $Q_{REGULATOR}$ and an operational amplifier V_Comp. It is supplied by an external supply voltage and controls the voltage at terminal Tap such that it equals a reference voltage which is present at terminal $V_{V\_REF}$.

The disadvantage of this topology is the noise injection into the VCO core through the NMOS transistors $Q_{TAIL}$ and $Q_{REGULATOR}$, which are themselves connected to noisy regulator or amplifier circuits. Since MOS transistors show high 1/f noise at low frequencies (<100 MHz), the phase noise performance of the VCO can be dominated by the properties of these devices. This is due to the fact that the low frequency 1/f noise is mixed up with the oscillation frequency and therefore becomes a contributor to the VCO's phase noise.

Figure 2:
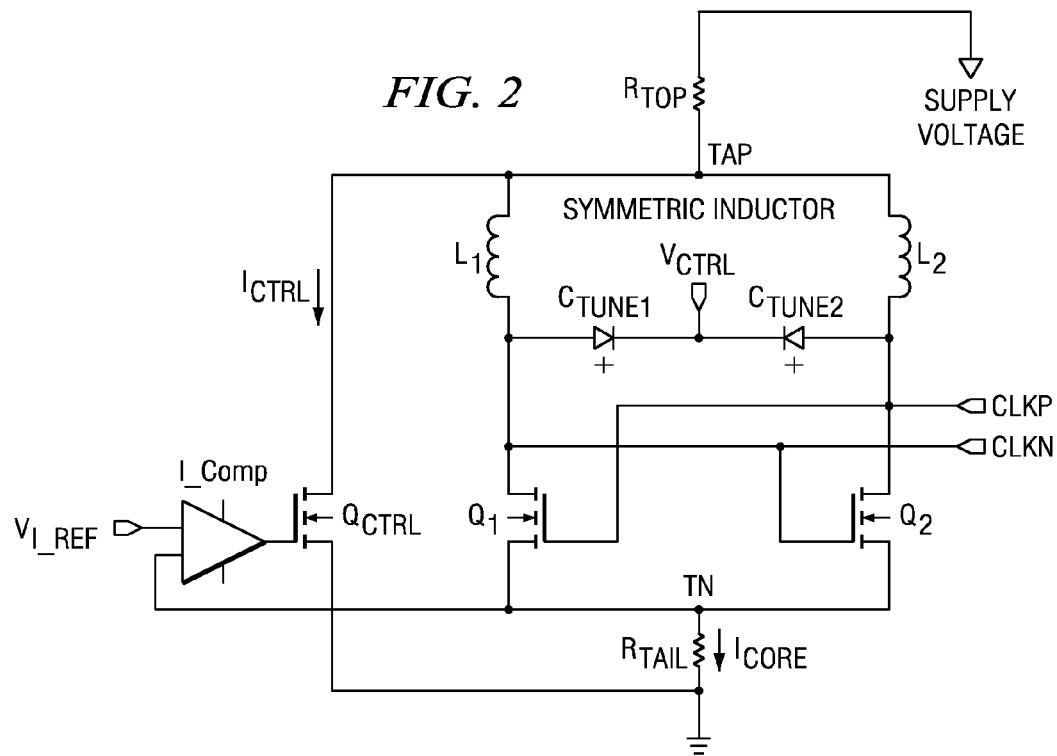
FIG. 2 is a circuit diagram of the inventive monolithic integrated LC-tank oscillator.

The inventive oscillator illustrated in FIG. 2 avoids this kind of phase noise contributors.

With reference now to FIG. 2, the oscillator circuit shown has a VCO core oscillator identical to that in FIG. 1. Thus, a symmetric inductor consists of inductors $L_1$, $L_2$. Inductors $L_1$, $L_2$ each have a first terminal connected to a supply node Tap and a second terminal connected to the drain of a respective one of differential NMOS transistors $Q_1$, $Q_2$, and to one of the tuneable capacitors (capacitance diodes) $C_{TUNE1}$ and $C_{TUNE2}$. The sources of transistors $Q_1$, $Q_2$ are connected to a tail node TN, and each transistor of the pair has its base connected to the other one of the pair.

The clock signal generated by the oscillator is the differential output voltage at terminals CLKP and CLKN. Its frequency can be tuned within a certain range by a control voltage applied to capacitors $C_{tune1}$ and $C_{tune2}$ at terminal VCTRL. The oscillator is therefore a voltage controlled oscillator (VCO). The VCO core consists of the LC-Tank (symmetric inductor $L_1$ and $L_2$ and tuneable capacitors $C_{TUNE1}$ and $C_{TUNE2}$) and the NMOS differential pair $Q_1$ and $Q_2$.

The topology shown in FIG. 2 is an alternative scheme for the bias generation and supply voltage regulation of the oscillator. Compared to FIG. 1, $Q_{TAIL}$ and $Q_{REGULATOR}$ are eliminated and replaced by resistors $R_{TOP}$ and $R_{TAIL}$.

An operational amplifier I_Comp controls the voltage drop across $R_{TAIL}$ such that it equals the reference voltage $V_{I\_REF}$. Since the current of $R_{TAIL}$ is identical with the VCO core current $I_{CORE}$, this control loop directly regulates the VCO core current to be constant:

$$I_{CORE} = V_{I\_REF}/R_{TAIL}.$$

This is accomplished by applying control current $I_{CTRL}$ on resistor $R_{TOP}$ through a current control NMOS transistor $Q_{CTRL}$ that has its drain connected to the supply node Tap, its source connected to ground and its gate connected to the output of comparator I_Comp. The control current changes the voltage at the supply node Tap of the symmetric inductor and thus the VCO core current $I_{CORE}$.

The advantage of this scheme over the topology in FIG. 1 is the elimination of both noise contributors, the tail current transistor $Q_{TAIL}$ and the voltage regulator transistor $Q_{REGULATOR}$. In addition, due to the fact that the VCO core current is controlled by a feedback loop to be constant, noise contents within the feedback loop's bandwidth are cancelled out. This leads to an additional phase noise improvement.

The invention claimed is:

1. A CMOS LC_TANK oscillator comprising:
a pair of symmetric inductors; and
a differential pair of transistors,
wherein said inductors have a first one of their terminals interconnected at a
supply node to which a voltage supply is applied through a supply resistor and a second terminal connected to the drain of a respective one of said transistors,
said transistors having their sources interconnected at a tail node which is connected to ground through a tail resistor, and further comprising a current control loop for controlling
a core current between said top and tail nodes so as to keep a voltage drop across said tail resistor at a level determined by a reference voltage; wherein said current control loop includes a current control transistor that has a current path connected between the supply node and ground, an operational amplifier with a first input connected to the reference voltage, a second input connected to said tail node and an output connected to the gate of said current control transistor.

2. The oscillator of claim 1, wherein said current control loop includes a controlled current path between the supply node and ground.

3. The oscillator according to any of claim 1, wherein the second terminals of said inductors are each connected to a respective one of a pair of capacitance diodes.

4. The oscillator of claim 3, wherein said capacitance diodes have one of their terminals connected to a common control voltage terminal.

* * * * *